United States Patent
Pritchard et al.

(10) Patent No.: US 10,186,524 B2
(45) Date of Patent: Jan. 22, 2019

(54) FULLY DEPLETED SILICON-ON-INSULATOR (FDSOI) TRANSISTOR DEVICE AND SELF-ALIGNED ACTIVE AREA IN FDSOI BULK EXPOSED REGIONS

(71) Applicant: GLOBALFOUNDRIES Inc., Grand Cayman (KY)

(72) Inventors: David Pritchard, Glenville, NY (US); Lixia Lei, Clifton Park, NY (US); Deniz E. Civay, Clifton Park, NY (US); Scott D. Luning, Albany, NY (US); Neha Nayyar, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/912,141

(22) Filed: Mar. 5, 2018

(65) Prior Publication Data
US 2018/0197882 A1   Jul. 12, 2018

Related U.S. Application Data

(62) Division of application No. 15/388,772, filed on Dec. 22, 2016, now Pat. No. 9,941,301.

(51) Int. Cl.
| | |
|---|---|
| H01L 27/12 | (2006.01) |
| H01L 29/49 | (2006.01) |
| H01L 21/84 | (2006.01) |
| H01L 29/06 | (2006.01) |
| H01L 29/40 | (2006.01) |

(Continued)

(52) U.S. Cl.
CPC .. *H01L 27/1203* (2013.01); *H01L 21/823418* (2013.01); *H01L 21/84* (2013.01); *H01L 29/0649* (2013.01); *H01L 29/401* (2013.01); *H01L 29/41783* (2013.01); *H01L 29/4916* (2013.01); *H01L 29/7838* (2013.01)

(58) Field of Classification Search
None
See application file for complete search history.

(56) References Cited

U.S. PATENT DOCUMENTS

| 5,492,857 A | 2/1996 | Reedy et al. |
| 5,973,382 A | 10/1999 | Burgener et al. |

(Continued)

*Primary Examiner* — Asok K Sarkar
*Assistant Examiner* — Grant Withers
(74) *Attorney, Agent, or Firm* — Ditthavong & Steiner P.C.

(57) ABSTRACT

Methods for eliminating the distance between a BULEX and SOI and the resulting devices are disclosed. Embodiments include providing a silicon layer on a BOX layer on a silicon substrate; forming two active areas in the silicon layer, separated by a space; forming first and second polysilicon gates over one active area, a third polysilicon gate over the space, and fourth and fifth polysilicon gates over the other active area, the second and fourth gates abutting edges of the space; forming spacers at opposite sides of each gate; removing the second, third, and fourth gates and the corresponding spacers; removing the silicon layer and BOX layer in the space, forming a trench and exposing the silicon substrate; forming second spacers on sidewalls of the trench; forming raised source/drain regions on each active area; and forming a p-well contact on the silicon substrate between the second spacers.

20 Claims, 6 Drawing Sheets

(51) Int. Cl.
  *H01L 29/417*   (2006.01)
  *H01L 29/78*    (2006.01)
  *H01L 21/8234*  (2006.01)

(56) References Cited

U.S. PATENT DOCUMENTS

| | | | |
|---|---|---|---|
| 6,100,567 A | 8/2000 | Burr | |
| 9,660,034 B1* | 5/2017 | Galy | H01L 21/84 |
| 9,825,185 B1 | 11/2017 | Li et al. | |
| 2013/0175594 A1* | 7/2013 | Basker | H01L 21/84 |
| | | | 257/301 |
| 2013/0321057 A1* | 12/2013 | Soussan | H01L 27/1203 |
| | | | 327/319 |
| 2014/0015052 A1* | 1/2014 | Fenouillet-Beranger | H01L 27/1203 |
| | | | 257/348 |
| 2014/0017821 A1* | 1/2014 | Fenouillet-Beranger | H01L 25/07 |
| | | | 438/10 |
| 2014/0319648 A1* | 10/2014 | Fenouillet-Beranger | H01L 27/0259 |
| | | | 257/526 |
| 2015/0041900 A1* | 2/2015 | Weber | H01L 27/092 |
| | | | 257/351 |
| 2015/0093861 A1* | 4/2015 | Loubet | H01L 21/84 |
| | | | 438/154 |
| 2015/0137874 A1* | 5/2015 | Cathelin | H01L 29/78648 |
| | | | 327/530 |
| 2015/0263707 A1* | 9/2015 | Kumar | H03K 3/3565 |
| | | | 327/205 |
| 2016/0013205 A1* | 1/2016 | Vinet | H01L 21/762 |
| | | | 257/351 |
| 2018/0012965 A1* | 1/2018 | Athanasiou | H01L 29/78615 |
| 2018/0061838 A1* | 3/2018 | El Dirani | G11C 11/409 |

* cited by examiner

BACKGROUND

BACKGROUND

FULLY DEPLETED SILICON-ON-INSULATOR (FDSOI) TRANSISTOR DEVICE AND SELF-ALIGNED ACTIVE AREA IN FDSOI BULK EXPOSED REGIONS

RELATED APPLICATION

The present application is a Divisional of application Ser. No. 15/388,772, filed on Dec. 22, 2016, which is incorporated herein by reference in its entirety.

TECHNICAL FIELD

This disclosure relates to transistor device manufacture. In particular, this disclosure relates to manufacture of fully depleted silicon-on-insulator (FDSOI) devices.

BACKGROUND

Earlier methods for forming FDSOI devices rely on abundant placement of back gates and well taps that result in overhead loss to chip density. The size of the contacts are determined by opening the SOI to expose bulk silicon, which must be disposed at a distance away from active FDSOI gates. This distance diminishes active area efficiency, thereby increasing minimum chip size.

A need exists for methodology enabling minimization of a space between a well contact and an active FDSOI gate and the resulting device.

SUMMARY

An aspect of the present disclosure is a method of reducing the size of a back gate and well tap by forming a self-aligned edge using a bulk exposed layer (BULEX) edge to separate the well tap from source/drain regions.

Another aspect of the present disclosure is a device including source/drain regions separated from a back gate and well tap only by spacers on a BULEX edge.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including providing a silicon layer on a bulk oxide (BOX) layer on a silicon substrate; forming first and second active areas in the silicon layer, separated by a space; forming first and second polysilicon gates over the first active area, a third polysilicon gate over the space, and fourth and fifth polysilicon gates over the second active area, the second and fourth polysilicon gates abutting edges of the space; forming first spacers at opposite sides of each of the first, second, third, fourth, and fifth polysilicon gates; removing the second, third, and fourth polysilicon gates and the corresponding first spacers; removing the silicon layer and BOX layer in the space between the first and second active areas, forming a trench, exposing the silicon substrate; forming second spacers on sidewalls of the trench; forming raised source/drain regions on the first and second active areas; and forming a p-well contact on the silicon substrate between the second spacers.

Aspects include forming the first, second, third, fourth, and fifth polysilicon gates evenly spaced from each other. Further aspects include removing the second, third, and fourth polysilicon gates and the corresponding first spacers with a cut mask. Other aspects include removing the second, third, and fourth polysilicon gates and the corresponding first spacers by etching. Another aspect includes forming the raised source/drain regions by epitaxial growth. Another Additional aspects include forming the first and second active areas adjacent the space larger than the first and second active regions remote from the space.

Another aspect includes a method including providing a silicon layer on a bulk oxide (BOX) layer on a silicon substrate; forming first and second active areas in the silicon layer, separated by a space; forming a first polysilicon gate over the first active area, second and third polysilicon gates over boundaries between the space and the first and second active areas, respectively, and fourth and fifth polysilicon gates over the second active area; forming first spacers at opposite sides of each of the first, second, third, fourth, and fifth polysilicon gates; removing the second and third polysilicon gates and the corresponding first spacers; removing the silicon layer and BOX layer in the space between the first and second active areas, forming a trench, exposing the silicon substrate; forming second spacers on sidewalls of the trench; forming raised source/drain regions on the first and second active areas; and forming a p-well contact on the silicon substrate between the second spacers.

Aspects include forming the first, second, third, fourth, and fifth polysilicon gates evenly spaced from each other. Further aspects include removing the second and third polysilicon gates and the corresponding first spacers with a cut mask. Other aspects include removing the second, third, and fourth polysilicon gates and the corresponding first spacers by etching. Another aspect includes forming the raised source/drain regions by epitaxial growth. Additional aspects include forming the first and second active areas adjacent the space larger than the first and second active regions remote from the space.

Another aspect includes a device including a silicon layer over a bulk oxide (BOX) layer over a silicon substrate; a trench formed in the silicon layer and BOX layer, with the silicon substrate exposed in the trench; spacers formed on sidewalls of the trench; first and second polysilicon gates, with source/drain regions on the silicon layer between each polysilicon gate and the trench; and a p-well contact on the silicon substrate between the spacers.

Aspects include the source/drain regions being raised source/drain regions. Further aspects include the source/drain regions extending to the sidewalls of the trench. Other aspects include the p-well contact having a two contact poly pitch. Another aspect includes the source/drain regions extending one CPP between the trench and each of the first and second polysilicon gates. Additional aspects include the p-well contact having a one CPP. A further aspect includes the first and second polysilicon gates having a three CPP. Other aspects include a third polysilicon gate on the silicon layer, adjacent the second polysilicon gate, remote from the trench, the second and third polysilicon gates having a single CPP.

Additional features and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

The present disclosure addresses and solves the current problems of increased well contact to gate spacing, and increasing back-bias, which in turn diminishes device performance, attendant upon back gate placement in FDSOI devices. These problems are solved by, inter alia, forming a self-aligned edge using a bulk-exposed (BULEX) edge instead of trench isolation used in conventional methods, which typically require multiple cut outs to enable transistor access to wells of the device. The topology of the BULEX is used to preserve raised source/drain spacers, thereby isolating the well diffusion region from the transistor device diffusion region. Accordingly regions of BULEX directly abut the silicon oxide insulator (SOI) minimizing space between well contacts and the transistor (e.g., 0 nm) diffusion regions, thereby decreasing the total design area of the device.

Figure 1A:
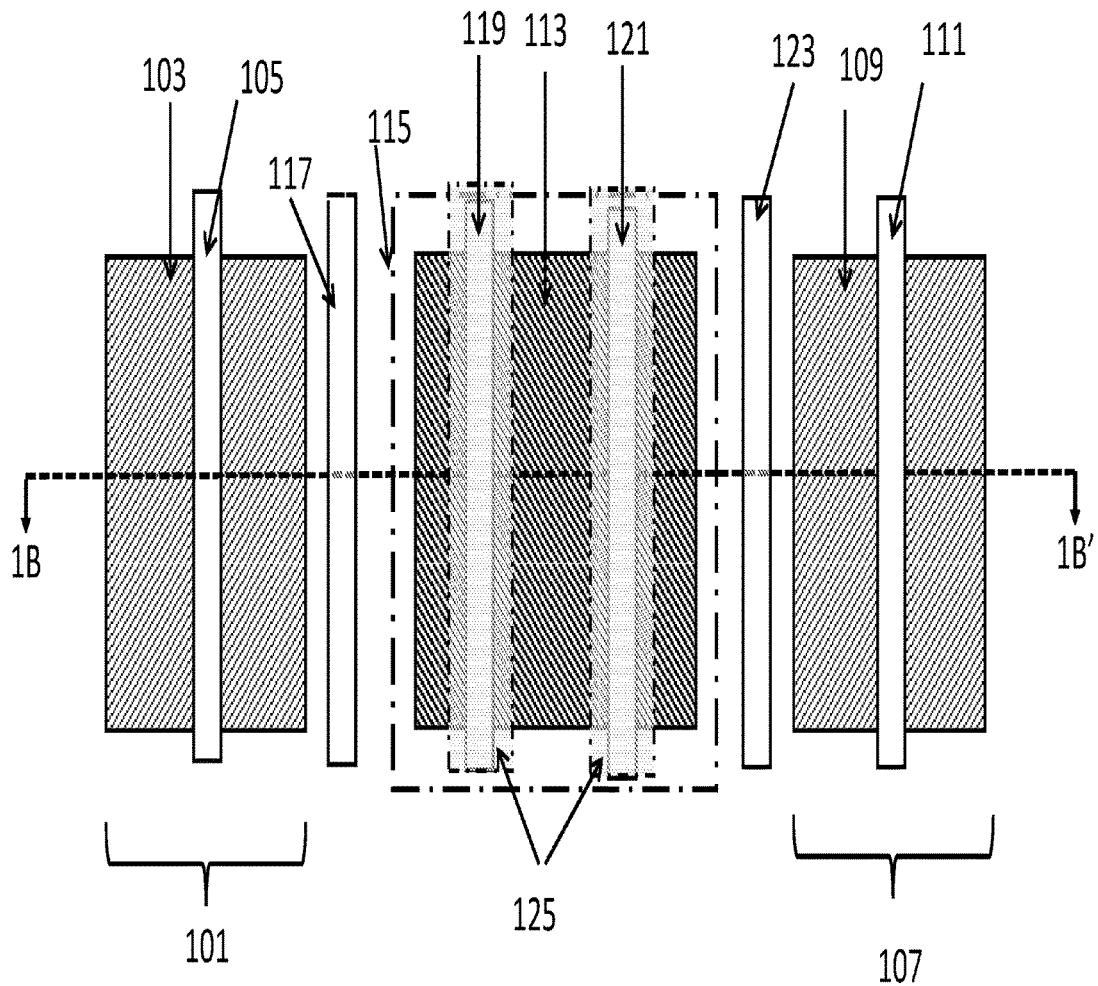
FIG. 1A shows a top view of a conventional semiconductor device.
Figure 1B:
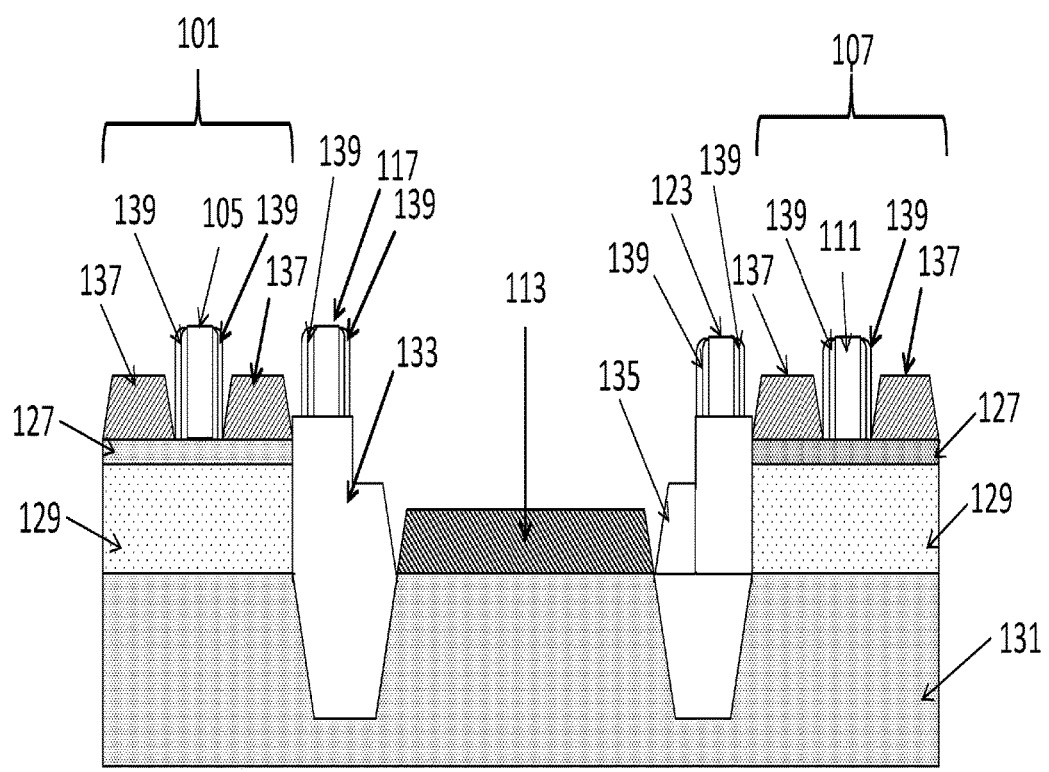
FIG. 1B shows a cross-sectional view along line 1B-1B' of the semiconductor device of FIG. 1A.

FIG. 1A shows a top view and FIG. 1B shows a cross-sectional view along line 1B-1B' of an earlier semiconductor device designed and formed with trench isolation techniques. As illustrated in FIG. 1A, a first p/n-FET 101 includes an active area (i.e., the transistor diffusion area) 103 and polysilicon gate 105, and a second p/n-FET 107 includes an active area 109 and polysilicon gate 111. An active area p-well tap 113 is formed within a BULEX region 115 between active areas 103 and 109. Dummy polysilicon gates 117, 119, 121, and 123 are formed simultaneously with gates 105 and 111, with dummy gates 119 and 121 being formed over the BULEX region 115. Prior to formation of the P-well tap 113, dummy gates 117 and 121 are removed with cut mask 125.

Adverting to FIG. 1B, first p/n-FET 101 and second p/n-FET 107 are formed on a silicon-on insulator (SOI) substrate, i.e, silicon layers 127, which are over bulk oxide (BOX) layers 129, which in turn are over silicon substrate 131. Shallow trench isolation (STI) regions 133 and 135 are formed (for example of silicon dioxide ($SiO_2$)) in substrate 131, isolating BULEX region 115 from p/n-FETs 101 and 107, respectively, and dummy gates 117 and 123 are formed over STI regions 133 and 135, respectively. Raised source/drain regions 137 are formed, for example by epitaxial growth, over the active areas 103 and 109, on opposite sides of each of polysilicon gates 105 and 111, separated from the polysilicon gates with spacers 139 (formed prior to the raised source/drain regions 137). Spacers 139 are likewise formed on opposite sides of each of dummy gates 117 and 123, forming a boundary for the region to be etched to form the BULEX region 115. The silicon substrate 131 between STI regions 133 and 135 may be exposed by etching away a portion of the silicon layer 127 and BOX 129, forming BULEX region 115, and the p-well contact may be formed in the BULEX region.

In FIGS. 1A and 1B, the well diffusion region 113 is isolated from the transistor diffusion regions 103 and 109 by way of STI regions 133 and 135 having non-functional dummy polysilicon gates 117 and 123. The distance between diffusion regions (a three contact poly pitch (CPP)) caused by interposing the STI regions and dummy polysilicon gates imposes design constraints, including a decrease in minimum chip size.

Figure 2A:
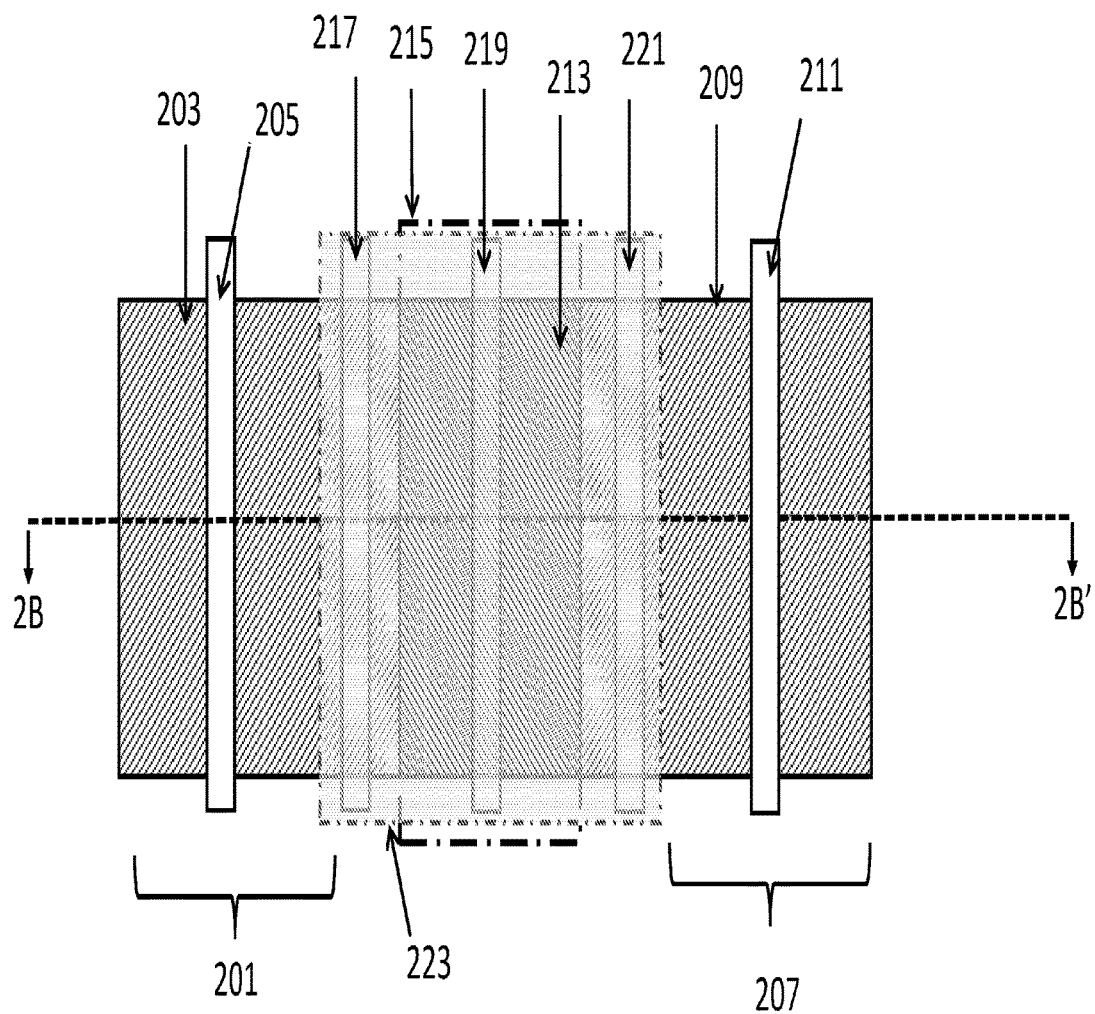
FIG. 2A shows a top view of a semiconductor device in accordance with an exemplary embodiment.
Figure 2B:
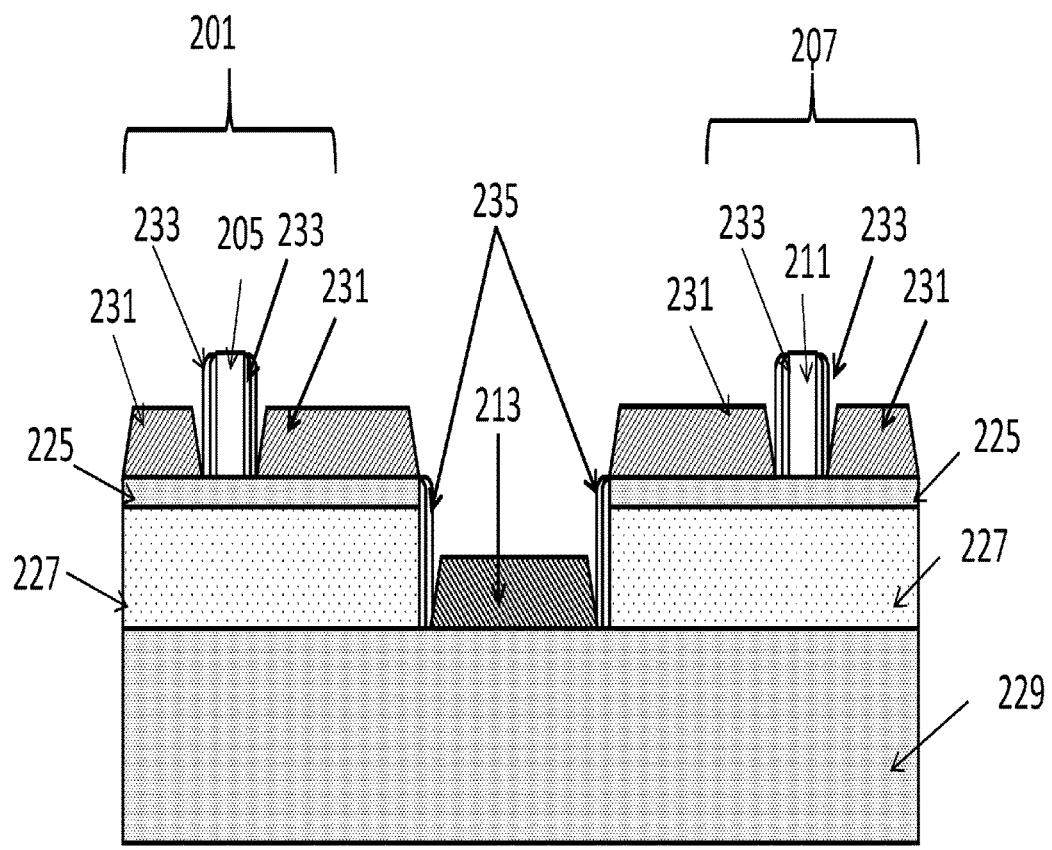
FIG. 2B shows a cross-sectional view along line 2B-2B' of the semiconductor device of FIG. 2A.

FIG. 2A illustrates a top view and FIG. 2B shows a cross-sectional view along line 2B-2B' of a semiconductor device in accordance with an exemplary embodiment. The semiconductor device includes a first p/n-FET 201, including an active area 203 and polysilicon gate 205, and a second p/n-FET 207, including an active area 209 and polysilicon gate 211. A p-well tap 213 is formed within a BULEX region 215, between p/n-FET 201 and p/n-FET 207. Dummy polysilicon gates 217, 219, and 221 are formed simultaneously with gates 205 and 211, with dummy gate 219 being formed over the BULEX region 215. The dummy gates are preserved to support neighboring gates for spacer formation uniformity concerns in gate first technologies. After spacer formation (shown in FIG. 2B), dummy gates 217, 219, and 221 are removed with cut mask 223. Adverting to FIG. 2B, like FIG. 1B, first p/n-FET 201 and second p/n-FET 207 are formed on silicon layers 225, which are over BOX layers 227, which in turn are over a bulk silicon substrate 229. However, no STI are formed in substrate 229, isolating BULEX region 215 from p/n-FETs 201 and 207, respectively. Instead, as shown in FIG. 2A, active areas 203 and 209 are extended towards BULEX region 215. Raised source/drain regions 231 are formed over the active areas 203 and 209, on opposite sides of each of polysilicon gates 205 and 211, separated from the polysilicon gates with spacers 233 (formed prior to the source/drain regions), with the source/drain regions between the polysilicon gates and the BULEX region 215 being extended to the edge of the active areas 203 and 209. The bulk silicon substrate 229 between the active areas 203 and 209 may be exposed by etching away a portion of the silicon layer 225 and BOX 227, forming BULEX region 115, and the p-well contact may be formed in the BULEX region 215. Spacers are formed at the edges of the BULEX region, and p-well tap 213 is formed between the spacers. The spacers may, for example, be formed of nitride, to a thickness of 5 nm to 10 nm. Thus, the p-well tap 213 is separated from first p/n-FET 201 and a second p/n-FET 207 only by spacers 235 formed on the BULEX edge. Accordingly, a total area of raised source/drain regions is maximized and device design efficiency is increased. The well diffusion region and the transistor diffusion regions are directly adjacent to each other, and are not interposed by space-consuming isolating material and dummy polysilicon gates. This embodiment has a two 2CPP well tap.

Figure 3A:
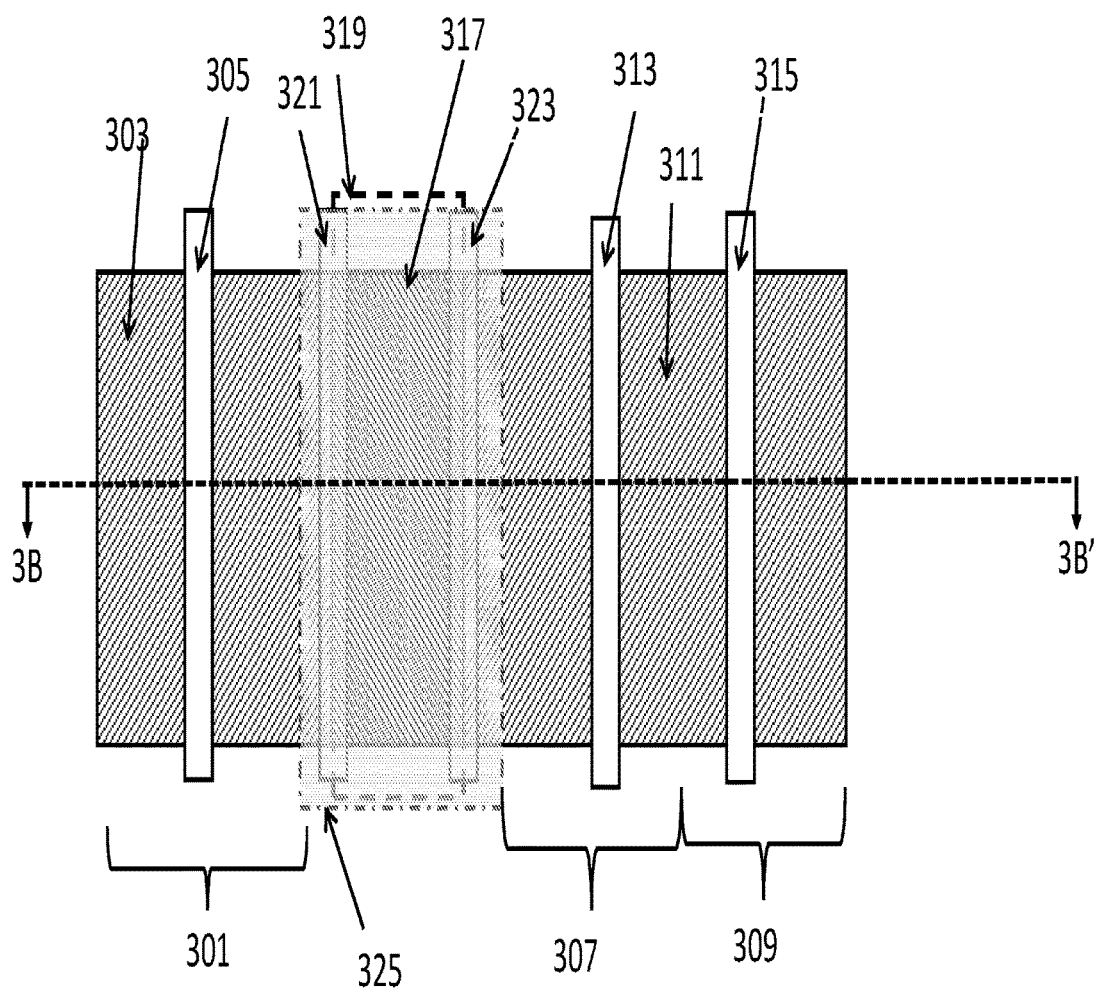
FIG. 3A shows a top view of a semiconductor device in accordance with another exemplary embodiment.
Figure 3B:
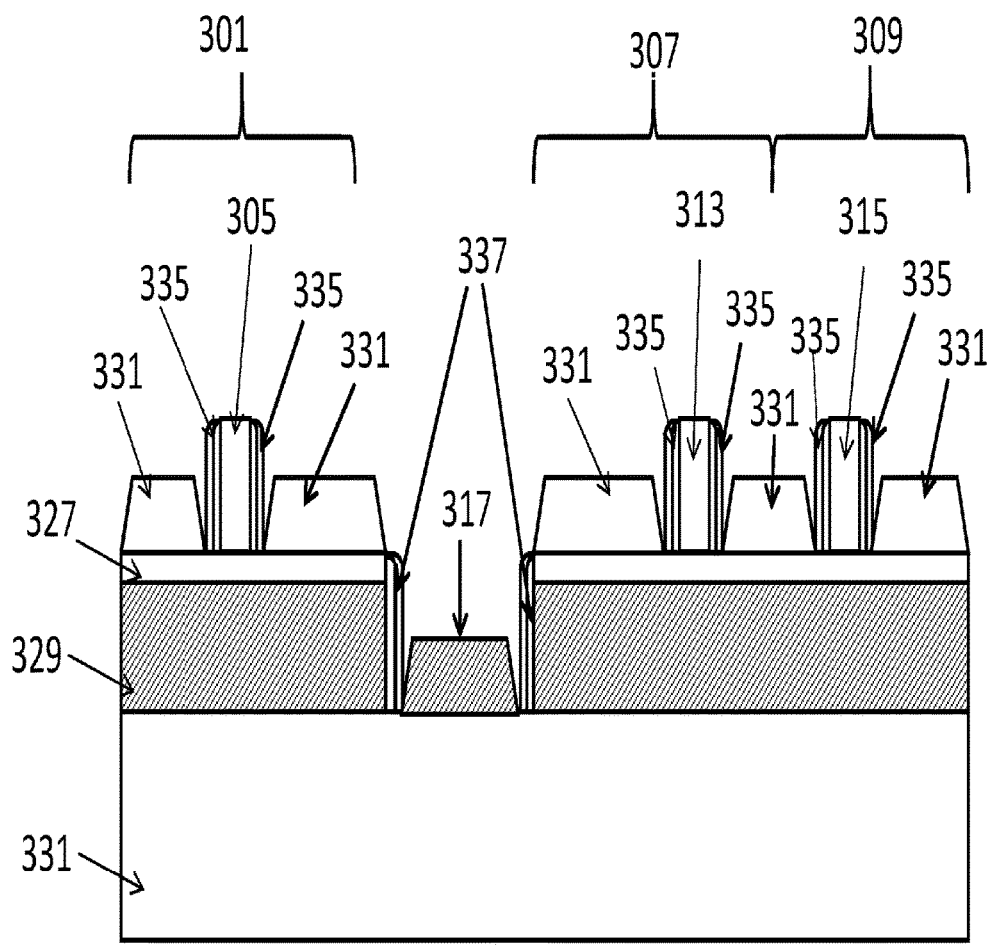
FIG. 3B shows a cross-sectional view along line 3B-3B' of the semiconductor device of FIG. 3A.

FIG. 3A shows a top view and FIG. 3B shows a cross-sectional view along line 3B-3B' of a semiconductor device in accordance with another exemplary embodiment. In this embodiment, dummy gates are not needed for spacer formation uniformity, so the well/back gate tap may be utilized in a single pitch (a single CPP). Adverting to FIG. 3A, the semiconductor device includes a first p/n-FET 301, including an active area 303 and a polysilicon gate 305, and second and third p/n-FETs 307 and 309, including active area 311 and polysilicon gates 313 and 315, respectively. The p-well 317 is within a BULEX region 319, between active areas 303 and 311. Simultaneously with gates 305, 313, and 315, dummy polysilicon gates 321 and 323 are formed over the boundaries between the BULEX region 319 and active regions 303 and 315, respectively. Prior to formation of the P-well tap 317, dummy gates 321 and 323 are removed with cut mask 325.

Adverting to FIG. 3B, first p/n-FET 301 and second p/n-FETs 307 and 309 are formed on a SOI substrate, i.e. silicon layers 327, which are over BOX layers 329, which in turn are over bulk silicon substrate 331. Raised source/drain regions 333 are formed over the active areas 303 and 311, on opposite sides of each of polysilicon gates 305, 313, and 315, separated from the polysilicon gates with spacers 335 (formed prior to the source/drain regions). The bulk silicon substrate 331 between the active areas 303 and 311 may be exposed by etching away a portion of the silicon layer 327 and BOX 329, forming BULEX region 319, and the p-well contact 317 may be formed in the BULEX region 319. Spacers 337 are formed at the edges of the BULEX region, and p-well tap 317 is formed between the spacers 337. The spacers may, for example, be formed of nitride, to a thickness of 5 nm to 10 nm. Thus, the p-well tap 317 is separated from first p/n-FET 301 and the second p/n-FET 307 only by spacers 337 formed on the BULEX edge. Accordingly, a total area of raised source/drain regions is maximized and device design efficiency is increased. The well diffusion region and the transistor diffusion regions are directly adjacent to each other, and are not interposed by space-consuming isolating material and dummy PC gates.

The embodiments of the present disclosure can achieve several technical effects including preserving raised source/drain spacers, isolating a well diffusion from a device diffusion region to accommodate abutting regions of BULEX to SOI to achieve a minimum space between a well contact and device to decrease total design area. Embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a silicon layer over a bulk oxide (BOX) layer over a silicon substrate;
    a trench formed in the silicon layer and BOX layer, with the silicon substrate exposed in the trench;
    separate spacers formed on sidewalls of the trench, wherein the separate spacers have exposed inner sidewalls;
    first and second polysilicon gates, with source/drain regions on the silicon layer between each polysilicon gate and the trench; and
    a p-well contact over a top surface of the silicon substrate between the separate spacers.

2. The device according to claim 1, wherein the source/drain regions are raised source/drain regions.

3. The device according to claim 1, wherein the source/drain regions extend to the sidewalls of the trench.

4. The device according to claim 1, wherein the p-well contact has a two contact poly pitch.

5. The device according to claim 4, wherein the source/drain regions extend one CPP between the trench and each of the first and second polysilicon gates.

6. The device according to claim 1, wherein the p-well contact has a one CPP.

7. The device of claim 6, wherein the first and second polysilicon gates have a three CPP.

8. The device of claim 6, further comprising:
    a third polysilicon gate on the silicon layer, adjacent the second polysilicon gate, remote from the trench, the second and third polysilicon gates having a single CPP.

9. A device comprising:
    first and second polysilicon gates formed over a silicon-on insulator (SOI) substrate;
    first separate spacers formed at opposite sides of the first and second polysilicon gates, wherein the first separate spacers have exposed inner sidewalls;
    a trench formed between the first and second polysilicon gates, with a p-well contact formed at the bottom of the trench, and over a top surface of the SOI substrate, wherein second spacers are formed on opposite sides of the trench; and
    raised source/drain (S/D) regions formed on the first and second active areas.

10. The device according to claim 9, wherein the raised S/D regions are epitaxially grown.

11. The device according to claim 10, wherein the raised S/D regions extend to the sidewalls of the trench.

12. The device according to claim 9, wherein the p-well contact has a two contact poly pitch.

13. The device according to claim 12, wherein the raised S/D regions extend one CPP between the trench and each of the first and second polysilicon gates.

14. The device according to claim 9, wherein the p-well contact has a one CPP.

15. The device of claim 14, wherein the first and second polysilicon gates have a three CPP.

16. The device of claim 14, further comprising:
    a third polysilicon gate on the silicon layer, adjacent the second polysilicon gate, remote from the trench.

17. The device according to claim 16, wherein the second and third polysilicon gates have a single CPP.

18. A device comprising:
   first and second polysilicon gates formed over a silicon-on insulator (SOI) substrate;
   first separate spacers formed at opposite sides of the first and second polysilicon gates the first separate spacers having exposed inner sidewalls;
   a trench formed between the first and second polysilicon gates, with a p-well contact formed at the bottom of the trench, and over a top surface of the SOI substrate, wherein second spacers are formed on opposite sides of the trench;
   raised source/drain (S/D) regions formed on the first and second active areas; and
   a third polysilicon gate over the SOT, adjacent the second polysilicon gate, remote from the trench, and having third spacers formed at opposite sides.

19. The device according to claim 18, wherein the raised S/D regions extend to the sidewalls of the trench.

20. The device according to claim 18, wherein the p-well contact has a two contact poly pitch.

\* \* \* \* \*